Feb. 18, 1969 A. A. SCOTT ET AL 3,428,871
SEMICONDUCTOR HOUSING STRUCTURE HAVING FLAT STRAP
WITH RE-ENTRANT BENDS FOR ONE TERMINAL
Filed April 14, 1966

INVENTORS
ANGUS A. SCOTT
JOHN L. BOYER
BY RICHARD A. HARTMAN

OSTROLENK, FABER, GERB & SOFFEN
ATTORNEYS

United States Patent Office
3,428,871
Patented Feb. 18, 1969

3,428,871

SEMICONDUCTOR HOUSING STRUCTURE HAVING FLAT STRAP WITH RE-ENTRANT BENDS FOR ONE TERMINAL

Angus A. Scott, Palos Verdes Estates, John L. Boyer, El Segundo, and Richard A. Hartman, Palos Verdes Estates, Calif., assignors to International Rectifier Corporation, El Segundo, Calif., a corporation of California Filed Apr. 14, 1966, Ser. No. 542,639
U.S. Cl. 317—234 6 Claims
Int. Cl. H01l 5/02

ABSTRACT OF THE DISCLOSURE

A semiconductor housing consisting of a flat conductive base for receiving a semiconductor wafer; a housing cylinder; and a flat conductive strap having a generally U shape with re-entrant bends in each leg of the U. The base of the strap is connected to the top of a wafer positioned atop the flat conductive base. The wafer is encapsulated with a resilient potting compound and a rigid epoxy covers the top of the resilient potting compound and between the spaced U-shaped legs of the conductive strap.

This invention relates to semiconductor devices, and more particularly relates to a novel efficient housing structure for semiconductor devices which is inexpensive.

Semiconductor devices such as silicon rectifiers and the like are well known, and considerable effort has been expended in the provision of housing structures for such devices. Generally, these housings tend to be expensive and require the use of expensive manufacturing techniques. In the past, the failure to follow commonly accepted housing practices in the interests of cheapness has had an adverse effect on the operation of the device as due to poor thermal connection between the wafer and large volume heat sinks or by the failure to provide a sufficiently flexible conductor for one surface of the brittle semiconductor wafer.

The present invention is for a novel housing construction for semiconductor devices which is very inexpensive and lends itself to the use of inexpensive manufacturing techniques requiring a minimum of training for assembly personnel. In addition, the novel housing construction of the invention provides an extremely effective heat transmission to large volume heat sinks, and provides a flexible connection to the brittle wafer to prevent wafer damage due to thermal cycling.

More particularly, and in accordance with the invention, the wafer of semiconductor material which has a junction therein and which may be preassembled between molybdenum disks, or the like, is first soldered to a conductive base which may be of any desired type, such as a stud-type base or a rectangular base adapted for clamping to a bus.

A hollow cylinder housing is brazed in any desired manner to the conductive base surrounding both the wafer and the flat conductor with the end of the conductor extending above the upper end of the cylinder. A novel flat conductor having a re-entrant bend portion therein then has the base thereof suitably soldered to the opposite surface of the wafer with the upper end of the flat conductor serving as a terminal for the diode. Thereafter, a soft resilient potting material such as a silicone rubber or soft resin is poured into the containing cylinder to a level above the re-entrant section of the conductor and the wafer, and this potting medium is cured.

Finally, the entire cylinder is filled to its top with a hard high temperature epoxy resin for the provision of mechanical strength with the edge of the cylinder being provided with an inwardly turned lip to provide a mechanical interlock for the epoxy cylinder. This then completes the entire manufacture of the device with the re-entrant portion of the conductive strap embedded within the resilient rubber cylinder providing sufficient flexibility to prevent the transmission of mechanical stresses from the strap to the wafer. The potting, of course, forms a hermetic seal about the wafer.

It will be apparent that the entire structure is extremely inexpensive, and uses very simple manufacturing techniques.

Accordingly, a primary object of this invention is to provide a novel housing for semiconductor devices which is inexpensive.

Yet another object of this invention is to provide a novel housing structure for semiconductor devices in which the usual flexible cable conductor for high current units is replaced by a rigid conductive strap having a re-entrant portion embedded in a soft potting medium.

Yet another object of this invention is to provide a novel housing structure for semiconductor devices which uses a novel potting medium incorporating a first flexible potting medium which surrounds the wafer and a portion of a resilient conductor extending from the wafer, and a second cylindrical layer of a hard high temperature-resistant potting medium which mechanically supports the terminal extending from the wafer with respect to the housing.

Yet another object of this invention is to provide a novel housing structure for semiconductor devices which permits good thermal connection between a semiconductor wafer and a heat sink and a flexible connection between a relatively rigid conductor extending from the wafer and the wafer itself.

These and other objects of this invention will become apparent from the following description when taken in connection with the drawings, in which.

Figure 1:
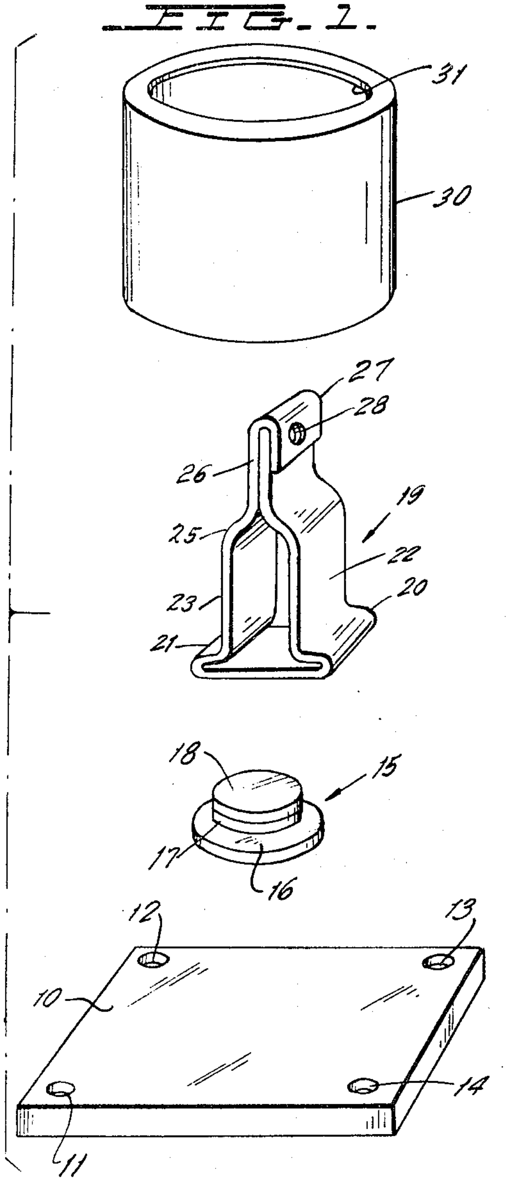
FIGURE 1 is an exploded perspective view of the components which form the novel housing construction of the invention.

Referring now to FIGURES 1–4, the novel housing construction is illustrated as using a flat copper base 10 which may have, for a 250 ampere diode device, a length of 2¼ inches, a width of 2¼ inches and a thickness of ¼ inch. Mounting holes 11, 12, 13 and 14 which may have a diameter of 0.281 inch are then placed in the corners of base 10 for the reception of mounting bolts which mount the assembly to a suitable bus, or the like. It will, of course, be apparent that the invention can also be applied to a stud-mounted type unit wherein a threaded stud could extend from the base of mounting plate 10.

An assembly 15, which includes a lower molybdenum plate 16, a semiconductor wafer 17 having at least one junction therein, and an upper molybdenum plate 18 is then preassembled according to usual manufacturing techniques wherein the wafer 17 is suitably brazed or soldered to the plates 16 and 18 which have a thermal coefficient of expansion which closely matches that of wafer 17.

The assemblage 15 is then soldered or brazed to a central portion of plate 10, as illustrated in FIGURE 12. Thereafter, a conductive strap 19 is bent to the shape best shown in FIGURE 1 where the strap will have a generally U shape where the base of the U will include re-entrantly bent portions 20 and 21 which serve as points of easy flexing for the entire strap assembly. Legs 22 and 23 of the U are spaced from one another by approximately ½ inch to permit the easy entry of potting medium to the interior of the U-shaped conductor 19. Note that the largest dimension across the base at re-entrant portions 20 and 21 could be about 1 inch.

The straps are then inwardly bent at portions 24 and 25 so that they come into surface-to-surface engagement along juncture 26 to define a terminal with leg 23 overlapping leg 22 at the top of the straps to define a projecting terminal connection 27 having an opening 28 punched therethrough. Clearly, the U-shaped conductor 19 will be preshaped prior to its assembly in the housing of FIGURES 1–4.

A suitable material for conductor 19 is a copper strap having a width of 0.625 inch and a thickness of 0.040 inch where the device is to be used for a 250 ampere diode.

Figure 2:
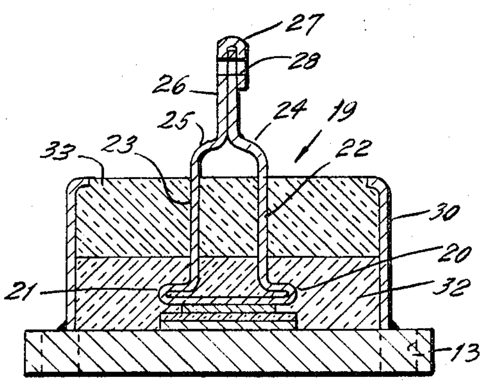
FIGURE 2 is a cross-sectional view of an assembled housing constructed in accordance with the invention wherein the components of FIGURE 1 are assembled, and the potting medium is added.
Figure 3:
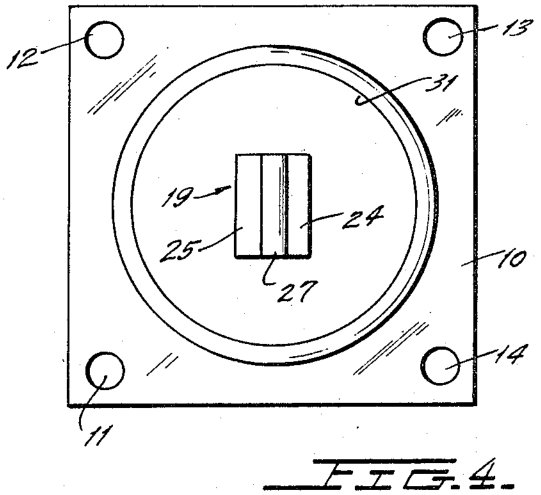
FIGURE 3 is a top view of FIGURE 2.
Figure 4:
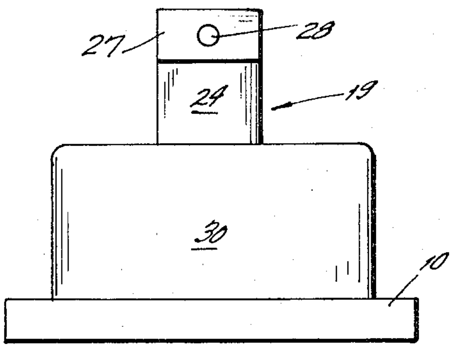
FIGURE 4 is a side plan view of FIGURE 3.

The bottom surface of the U-shaped conductor 19 is then suitably soldered or brazed to the upper molybdenum disk 18, as shown in FIGURE 2. Thereafter, a hollow steel cylinder 30 which has an inwardly bent upper lip 31 has its lower end suitably brazed or soldered to the base plate 10 symmetrically surrounding the previously assembled wafer assembly 15 and conductor 19. The diameter of cylinder 30 can be approximately 1¾ inches, while the height of cylinder 30 can be approximately 1½ inches. Preferably, the top of the cylinder 31 will fall below the beginning of juncture 26 between strap halves 22 and 23, as shown in FIGURE 2, to permit the easy passage of air from the region between straps 22 and 23 when a potting compound is subsequently introduced into the cylinder 30.

After cylinder 30 is secured to plate 10, a resilient potting medium 32 is poured into cylinder 30 to a height of approximately ⅜ of an inch or whatever height is needed to sufficiently cover both the wafer assembly 15 and the re-entrant portions 20 and 21 of conductor 19. A suitable potting medium is a silicone rubber which can permit flexure of re-entrant portions 20 and 21 due to thermal expansion and contraction of conductor 19.

After the resilient layer 32 is cured, a second potting medium 33 is poured into cylinder 30 and fills the cylinder to its upper end, as illustrated in FIGURE 2. The potting medium 33 is preferably a hard, high temperature epoxy resin of any desired type which provides sufficient mechanical strength to securely connect the conductor 19 to the cylinder 30. Note that the lip 31 of cylinder 30 will securely locate the epoxy cylinder 33 into position with respect to cylinder 30 to rigidly prevent axial movement of the cylinder 33.

From the foregoing, it will be apparent that the novel housing structure of the drawings is inexpensive in that it uses simple components which can each be easily pre-formed prior to their assembly. Moreover, the invention provides a housing structure which can be assembled by relatively unskilled personnel. However, even though the housing structure lends itself to such inexpensive assembly techniques and notwithstanding that the assembly components are themselves inexpensive, the housing arrangement complies with the best engineering practices with regard to the manufacture of a highly reliable semiconductor device. That is, the wafer assembly 15 is securely connected to the large volume heat sink defined by base plate 10 so that the wafer can be operated with relatively low temperatures when used in a properly designed circuit.

Moreover, the re-entrant sections 20 and 21 of the conductor 19 which is connected to wafer assembly 15 is hermetically embedded in a flexible potting medium so that this connector is permitted to flex under changing temperature conditions without imparting undesirable mechanical stresses to the wafer assembly 15. Note that this portion of the invention replaces the commonly used flexible cable conductors which have always been thought essential for this purpose, notwithstanding their expense.

Finally, it will be apparent that an effective hermetic seal is formed around the wafer 15 where the potting medium formed in two layers has a first layer to absorb the flexing of re-entrant portions 20 and 21, while the upper potting medium 33 serves the mechanical function of holding the conductor 19 in position with respect to cylinder 30.

Figure 5:
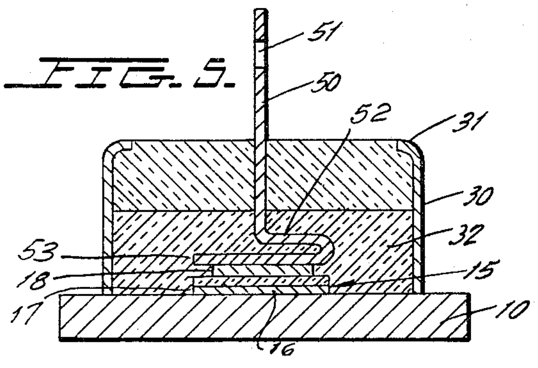
FIGURE 5 shows a cross-sectional view similar to FIGURE 2 of a second embodiment of the invention.

FIGURE 5 illustrates one of the various possible modifications for carrying out the present invention. In FIGURE 5, components identical to those of FIGURES 1 through 4 have been given similar identifying numerals. FIGURE 5 differs from FIGURES 1 through 4 in the configuration of the conductor connected to wafer assembly 15 shown in FIGURES 1 through 4 as conductor 19. In FIGURE 5, only one-half of conductor 19 of FIGURES 1–4 is used, as shown by the conductor 50 having a terminal opening 51 therein extending above the potting medium 33. The lower end of conductor 50 contains a re-entrant bend 52 and a bottom section 53 defining a generally L-shaped configuration. The bottom of portion 53 is then suitably secured as by soldering to the upper molybdenum plate 18 in any desired manner. Note that the arrangement of FIGURE 5 will operate in the same manner as that described for FIGURES 1 through 4 in that the re-entrant portion 52 is embedded in the resilient potting material 32 so that it will permit flexure of bent portion 52 and prevent the application of stress from conductor 50 to the wafer assembly 15.

Note that the current carrying cross-section area of the single conductor 50 will have to be increased somewhat so that the entire conductor will operate at approximately the same current density of the U-shaped conductor 19 of FIGURES 1–4.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A housing for a semiconductor wafer; said housing comprising a conductive support plate, a hollow cylinder having a bottom and top end, and a flat conductor having a re-entrant bend at one portion thereof; one surface of said semiconductor wafer connected to a centrally located portion of the surface of said support plate; said bottom end of said hollow cylinder connected to said surface of said conductive support plate and surrounding said semiconductor wafer; said flat conductor having one end thereof connected to the opposite surface of said semiconductor wafer and extending outwardly and coaxially with said cylinder from said surface of said support plate; the other end of said flat conductor extending beyond said top end of said hollow cylinder; said re-entrant bend of said flat conductor positioned adjacent said other end of said support plate and generally located toward the bottom of the volume enclosed by said hollow cylinder; and a resilient potting material filling at least the bottom portion of the volume enclosed by said hollow cylinder and covering said semiconductor wafer and said re-entrant bend of said flat conductor; said flat conductor bent to a generally U shape having side legs and a base; the connection between each of said side legs and said base including respective re-entrant bends defining said re-entrant bend at said one portion of said flat conductive strap; said base connected to said opposite surface of said semiconductor wafer; said side legs bent inwardly toward one another at a region above the said top end of said hollow cylinder and connected to one another to define a terminal for said semiconductor wafer; and a rigid potting material covering said resilient potting material and extending from the upper surface of said resilient potting material to the top end of said hollow cylinder; said rigid potting material rigidly connecting said hollow cylinder to said flat conductor.

2. The housing of claim 1 wherein said top end of said cylinder has an inwardly bent rim to capture the top of said rigid potting material.

3. The housing substantially as set forth in claim 1 wherein said flat conductor is of copper having a cross-sectional area of approximately 0.050 square inch.

4. The housing as set forth in claim 2 wherein said semiconductor wafer includes a silicon wafer having a rectifying junction therein and metallic plates secured to the opposing surfaces thereof having substantially the same thermal coefficient of expansion as said silicon wafer.

5. The housing substantially as set forth in claim 4 wherein said flat conductor is of copper having a cross-sectional area of approximately 0.050 square inch.

6. A housing for a semiconductor wafer; said housing comprising a conductive support plate, a hollow cylinder having a bottom and top end, and a flat conductor having a re-entrant bend at one portion thereof; one surface of said semiconductor wafer connected to a centrally located portion of the surface of said support plate; said bottom end of said hollow cylinder connected to said surface of said conductive support plate and surrounding said semiconductor wafer; said flat conductor having one end thereof connected to the opposite surface of said semiconductor wafer and extending outwardly and coaxially with said cylinder from said surface of said support plate; the other end of said flat conductor extending beyond said top end of said hollow cylinder; said re-entrant bend of said flat conductor positioned adjacent said other end of said support plate and generally located toward the bottom of the volume enclosed by said hollow cylinder;

and a resilient potting material filling at least the bottom portion of the volume enclosed by said hollow cylinder and covering said semiconductor wafer and said reentrant bend of said flat conductor; said flat conductor bent to a generally U shape having side legs and a base; the connection between each of said side legs and said base including respective re-entrant bends defining said re-entrant bend at said one portion of said flat conductive strap, said base connected to said opposite surface of said semiconductor wafer; and a rigid potting material covering said resilient potting material and extending from the upper surface of said resilient potting material to the top end of said hollow cylinder; said rigid potting material rigidly connecting said hollow cylinder to said flat conductor; said side legs bent inwardly toward one another at a region above the top of said resilient potting material; at least portions of said flat conductor extending above said top end of said cylinder to define a terminal for said semiconductor wafer.

References Cited

UNITED STATES PATENTS

| | | | |
|---|---|---|---|
| 2,822,512 | 2/1958 | French | 317—234.6 |
| 2,853,661 | 9/1958 | Houle et al. | 317—234.3 |
| 2,906,932 | 9/1959 | Fedotowsky et al. | 317—234.3 |
| 2,946,935 | 7/1960 | Finn | 317—234.3 |
| 2,981,873 | 4/1961 | Eannarino et al. | 317—234.3 |
| 3,188,536 | 6/1965 | Rittmann | 317—235.1 |
| 3,223,903 | 12/1965 | Solomon | 317—234.3 |
| 3,253,319 | 5/1966 | Rittmann et al. | 317—234.4 |

JOHN W. HUCKERT, *Primary Examiner.*

R. F. POLISSACK, *Assistant Examiner.*

U.S. Cl. X.R.

317—235